US010720670B2

(12) United States Patent
Libsch et al.

(10) Patent No.: US 10,720,670 B2
(45) Date of Patent: Jul. 21, 2020

(54) SELF-ALIGNED 3D SOLID STATE THIN FILM BATTERY

(71) Applicant: INTERNATIONAL BUSINESS MACHINES CORPORATION, Armonk, NY (US)

(72) Inventors: Frank Robert Libsch, White Plains, NY (US); Ghavam G. Shahidi, Pound Ridge, NY (US); Ko-Tao Lee, Yorktown Heights, NY (US); Stephen M. Rossnagel, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 206 days.

(21) Appl. No.: 15/892,404

(22) Filed: Feb. 8, 2018

(65) Prior Publication Data
US 2019/0245247 A1 Aug. 8, 2019

(51) Int. Cl.
H01M 10/058 (2010.01)
H01M 10/0585 (2010.01)
(Continued)

(52) U.S. Cl.
CPC .......... *H01M 10/0585* (2013.01); *G03F 7/16* (2013.01); *H01G 11/12* (2013.01); *H01G 11/26* (2013.01);
(Continued)

(58) Field of Classification Search
CPC ......... H01M 10/0585; H01M 10/0562; H01M 4/021; H01M 4/0402; H01M 4/0407; H01M 4/0426; H01M 4/0428; H01M 4/525; H01M 4/583; G03F 7/16; G03F 7/30; G03F 7/36; G03F 7/40; H01L 21/0274;
(Continued)

(56) References Cited

U.S. PATENT DOCUMENTS 4,654,119 A 3/1987 Cook
4,816,356 A 3/1989 Balkanski
(Continued)

FOREIGN PATENT DOCUMENTS

KR 1020140106258 A 9/2014
WO 2017006591 A1 1/2017

OTHER PUBLICATIONS

List of IBM Patents or Applications Treated as Related.

*Primary Examiner* — Amanda C. Walke
(74) *Attorney, Agent, or Firm* — Intelletek Law Group, PLLC; Gabriel Daniel, Esq.

(57) ABSTRACT

A solid state electrochemical battery and a method of creation thereof are provided. There is a first conductive electrode on top of a substrate. There is a first polar conductor layer on top of the conductive electrode layer. A first solid electrolyte layer is on top of the first polar conductor layer. There is a second polar conductor layer on top of the first solid electrolyte layer and a second conductive electrode layer on top of the second polar conductor layer. A third polar conductor layer is on top of the second conductive electrode layer and a second solid electrolyte layer is on top of the third polar conductor layer. There is a fourth polar conductor layer on top of the second solid electrolyte layer and a third conductive electrode layer on top of the fourth polar conductor layer.

10 Claims, 10 Drawing Sheets

(51) Int. Cl.
*H01M 10/0562* (2010.01)
*G03F 7/16* (2006.01)
*H01G 11/26* (2013.01)
*H01G 11/12* (2013.01)
*H01G 11/86* (2013.01)
*H01G 11/56* (2013.01)
*H01M 4/583* (2010.01)
*H01M 4/04* (2006.01)
*H01M 4/525* (2010.01)
*H01L 21/027* (2006.01)
*H01L 21/311* (2006.01)
*H01L 21/033* (2006.01)
*G03F 7/40* (2006.01)
*G03F 7/30* (2006.01)
*G03F 7/36* (2006.01)

(52) U.S. Cl.
CPC ............. *H01G 11/56* (2013.01); *H01G 11/86* (2013.01); *H01L 21/0274* (2013.01); *H01L 21/0276* (2013.01); *H01L 21/033* (2013.01); *H01L 21/31105* (2013.01); *H01M 4/0402* (2013.01); *H01M 4/0407* (2013.01); *H01M 4/0426* (2013.01); *H01M 4/525* (2013.01); *H01M 4/583* (2013.01); *H01M 10/0562* (2013.01); *G03F 7/30* (2013.01); *G03F 7/36* (2013.01); *G03F 7/40* (2013.01); *H01M 2300/0068* (2013.01)

(58) Field of Classification Search
CPC ............... H01L 21/0276; H01L 21/033; H01L 21/0332; H01L 21/0337; H01L 21/0475; H01L 21/311; H01L 21/31105; H01L 21/31116; H01G 11/08; H01G 4/33; H01G 4/40

USPC ........................................................ 429/152
See application file for complete search history.

(56) References Cited

U.S. PATENT DOCUMENTS

| | | | |
|---|---|---|---|
| 6,235,621 B1 | 5/2001 | Jeng | |
| 6,383,945 B1 | 5/2002 | Huang et al. | |
| 6,664,006 B1 | 12/2003 | Munshi | |
| 6,982,132 B1 | 1/2006 | Goldner et al. | |
| 7,094,500 B2* | 8/2006 | Ugaji | H01M 4/0421 |
| | | | 429/231.9 |
| 9,941,507 B2* | 4/2018 | Pirk | H01M 4/04 |
| 2004/0058237 A1* | 3/2004 | Higuchi | H01M 6/188 |
| | | | 429/209 |
| 2012/0058380 A1 | 3/2012 | Wang et al. | |
| 2013/0149592 A1* | 6/2013 | Hayashi | H01M 4/66 |
| | | | 429/160 |
| 2015/0084157 A1* | 3/2015 | Tegen | H01L 21/822 |
| | | | 257/528 |
| 2015/0086809 A1* | 3/2015 | Lemke | H01M 10/0436 |
| | | | 429/7 |
| 2015/0165769 A1 | 6/2015 | Nystrom et al. | |
| 2015/0188195 A1* | 7/2015 | Matsushita | H01M 10/0585 |
| | | | 429/152 |
| 2015/0221974 A1 | 8/2015 | Upadhyaya et al. | |
| 2015/0340727 A1* | 11/2015 | Iwamoto | H01M 10/0463 |
| | | | 429/126 |
| 2015/0349370 A1* | 12/2015 | Snyder | H01M 10/02 |
| | | | 429/152 |
| 2017/0062834 A1 | 3/2017 | Unnikrishnan et al. | |
| 2017/0104195 A1 | 4/2017 | Bedjaoui et al. | |
| 2017/0155256 A1* | 6/2017 | Fujimaki | H01M 10/0585 |
| 2018/0006333 A1* | 1/2018 | Brew | H01M 10/0585 |
| 2018/0315965 A1* | 11/2018 | Fallourd | H01M 2/06 |
| 2019/0244815 A1* | 8/2019 | Libsch | H01L 21/0273 |
| 2019/0312298 A1* | 10/2019 | Ni | H01M 10/0436 |
| 2019/0319252 A1* | 10/2019 | Hasegawa | H01M 4/66 |

* cited by examiner

100

| CONDUCTIVE ELECTRODE N |
| 130 |

⋮

| CONDUCTIVE ELECTRODE 3 |
| 120 |
| POLAR CONDUCTOR 4 (CATHODE/ANODE) |
| 118 |
| ELECTROLYTE 2 |
| 116 |
| POLAR CONDUCTOR 3 (ANODE/CATHODE) |
| 114 |
| CONDUCTIVE ELECTRODE 2 |
| 112 |
| POLAR CONDUCTOR 2 (ANODE) |
| 110 |
| ELECTROLYTE 1 |
| 108 |
| POLAR CONDUCTOR 1 (CATHODE) |
| 106 |
| CONDUCTIVE ELECTRODE 1 |
| 104 |
| SUBSTRATE |
| 102 |

FIG. 1

SELF-ALIGNED 3D SOLID STATE THIN FILM BATTERY

BACKGROUND

Technical Field

The present disclosure generally relates to electrochemical cells, and more particularly, to solid state thin film batteries and the manufacture thereof.

Description of the Related Art

Today, electrochemical batteries are used in a variety of applications, including portable electronics (e.g., smart phones, tablets, emerging sub-millimeter sized intelligent Internet of Things (IOT), music players, etc.), power tools, remote sensors, power supplies for military and aerospace applications, power supplies for vehicles (e.g., hybrid electric vehicles, plug-in hybrid electric vehicles, and fully electric vehicles), etc. These batteries may be combined with other sources of power, such as internal combustion engines, capacitors, solar cells, fuel cells, etc. Common electrochemical cells typically use organic solvent electrolytes that may be in the form of a liquid or gel.

SUMMARY

According to one embodiment, a solid state electrochemical battery is provided. There is a first conductive electrode on top of a substrate. There is a first polar conductor layer on top of the conductive electrode layer. A first solid electrolyte layer is on top of the first polar conductor layer. There is a second polar conductor layer on top of the first solid electrolyte layer and a second conductive electrode layer on top of the second polar conductor layer. A third polar conductor layer is on top of the second conductive electrode layer and a second solid electrolyte layer is on top of the third polar conductor layer. There is a fourth polar conductor layer on top of the second solid electrolyte layer and a third conductive electrode layer on top of the fourth polar conductor layer.

In one embodiment, the first polar conductor layer includes a cathode of a first cell of the battery and the second polar conductor layer includes an anode of the first cell of the battery. In one embodiment, the third polar conductor layer includes an anode of a second cell of the battery, the fourth polar conductor layer includes a cathode of the second cell of the battery and the second cell is electrically connected in parallel with the first cell of the battery. In another embodiment, the third polar conductor layer includes a cathode of a second cell of the battery, the fourth polar conductor layer includes an anode of the second cell of the battery, and the second cell is electrically connected in series with the first cell of the battery.

In one embodiment, the first conductive electrode layer includes a first conductive electrode and a second conductive electrode, and the first conductive electrode and the second conductive electrode are electrically separate.

According to one embodiment, a method of creating a solid state electrochemical battery is provided. The method includes depositing a first conductive electrode layer on top of a substrate. A first polar conductor layer is deposited on top of the conductive electrode layer. A first solid electrolyte layer is deposited on top of the first polar conductor layer. A second polar conductor layer is deposited on top of the first solid electrolyte layer. A second conductive electrode layer is deposited on top of the second polar conductor layer. A third polar conductor layer is on top of the second conductive electrode layer. A second solid electrolyte layer is deposited on top of the third polar conductor layer. A fourth polar conductor layer is deposited on top of the second solid electrolyte layer. A third conductive electrode layer is then deposited on top of the fourth polar conductor layer.

In one embodiment, the first polar conductor layer includes a cathode of a first cell of the battery and the second polar conductor layer includes an anode of the first cell of the battery. In one embodiment, the third polar conductor layer includes an anode of a second cell of the battery, the fourth polar conductor layer includes a cathode of the second cell of the battery and the second cell is electrically connected in parallel with the first cell of the battery. In another embodiment, the third polar conductor layer includes a cathode of a second cell of the battery, the fourth polar conductor layer includes an anode of the second cell of the battery, and the second cell is electrically connected in series with the first cell of the battery.

In one embodiment, the first conductive electrode layer includes a first conductive electrode and a second conductive electrode, and the first conductive electrode and the second conductive electrode are electrically separate.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1, which illustrates a simplified cross-section view a self-aligned three-dimensional solid state thin film battery having a plurality of storage cells, consistent with an exemplary embodiment.

DETAILED DESCRIPTION

Overview

Figure 2A:
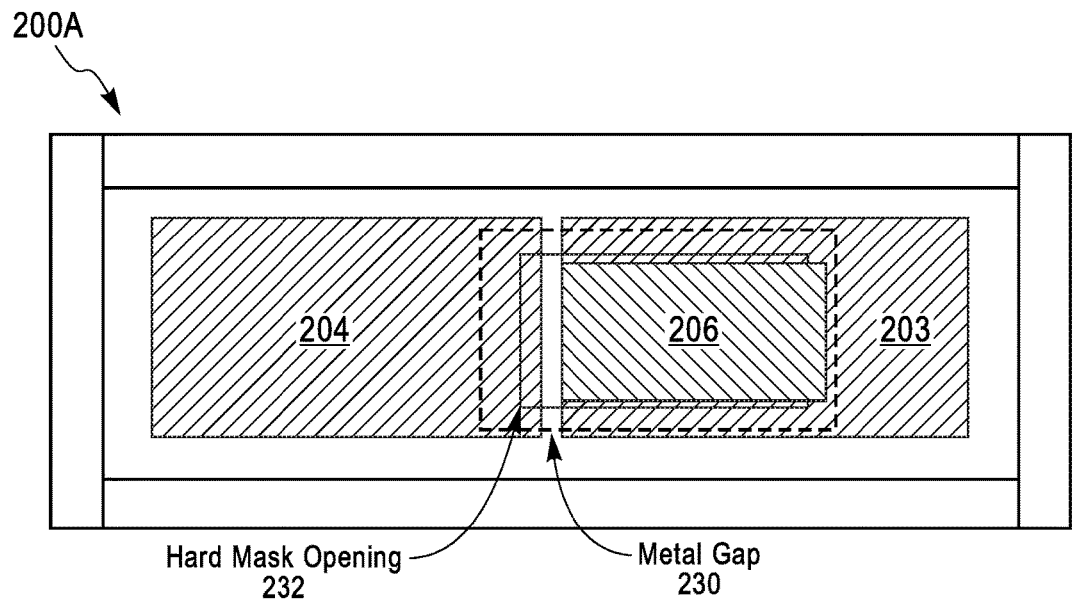
FIG. 2A illustrates a top view of a self-aligned three-dimensional solid state thin film battery during a first polar conductor deposition.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure relates to solid state thin film batteries and the manufacture thereof. Such solid-state batteries have several advantages over conventional batteries using liquid/gel electrolytes. While conventional batteries using liquid electrolytes, such as the lithium batteries, can provide high energy densities and provide rechargeable properties, they come with safety concerns, including the potential for flammability.

In contrast, a solid-state battery is intrinsically more stable than batteries based on liquid electrolyte cells, since it does not include a liquid that may cause uncontrolled reactions, such as thermal runaway, or even explosion. Unlike traditional structures, where there is an inherent tradeoff between energy density and power density, the structures discussed herein can overcome such constraints. Thus, a better optimization of high energy capacity with high power density is provided.

In one aspect, various layers, sometimes referred to herein as films, are self-aligned, which provides for scalability and lower cost, and a solid-state 3D battery integration. As the device size of today's electronics continues to shrink, the scalability of the battery becomes increasingly salient. Further, there is larger throughput volume (i.e., lower cost) and an all in-situ battery film deposition process that eliminates reactivity of exposed battery films. The structures discussed herein may eliminate the resulting shortened charge/discharge cycles as well as diminish charge capacity with cycling. Still further, safety is improved by eliminating flammable liquid electrolytes that are used in conventional battery fabrication methods by virtue of the solid-state electrolyte and fabrication process discussed herein. The techniques described herein may be implemented in a number of ways. Example implementations are provided below with reference to the following figures.

Example Layers of a Solid-State 3D Battery

Reference now is made to FIG. 1, which illustrates a simplified cross-section view a self-aligned three-dimensional solid state thin film battery (SSTFB) 100 having a plurality of storage cells, consistent with an exemplary embodiment. Battery 100 includes a substrate 102, a first conductive electrode layer 104, a first polar conductor layer 106, a first electrolyte layer 108, a second polar conductor layer 110, a second conductive electrode layer 112, a third polar conductor layer 114, a second electrolyte layer 116, a fourth polar conductor layer 118, and a third conductive electrode 124. The electrolyte layers 108 and 116 are ion deposition layers.

The battery 100 may be viewed as a plurality of storage cells stacked on top of one another. For example, layers 104 to 112 may be used at least in part to implement the first storage cell, and layers 112 to 120 may be used in part to implement the second storage cell. Electrode 112 has a dual purpose of providing better electrical (e.g., lower resistive) contact to the underlying second polar conductor 110, as well as providing the same lower resistive contact to the third polar conductor layer 114. In various embodiments, various numbers of cells may be stacked on top of each other and electrically coupled in series and/or in parallel to provide a battery 100 with increased voltage and/or current, respectively.

In one embodiment, the first polar conductor 106 is a cathode and the second polar conductor is an anode of the first cell of the battery 100. Further, when the stacked cells are electrically coupled in parallel, the third polar conductor 114 is an anode and the fourth polar conductor 118 is a cathode of the second cell. The parallel connection (e.g., to increase the current) and the serial connection (e.g., to increase the voltage) will be discussed in more detail later.

As described more fully below, the methods and devices disclosed herein may be formed in and above a bulk substrate 102, such as Si, $SiO_2$, and/or silicon on insulator (SOI). Accordingly, in various embodiments, the substrate 102 may be over a SOI layer (not shown) to prevent leakage and to improve device performance. Other materials that may be used include sapphire, aluminum oxide, germanium, gallium arsenide (GaAs), indium phosphide (InP), an alloy of silicon and germanium, etc. The substrate 102 can act as a conductor or an insulator, depending on the materials and concentrations chosen. Thus, as used herein, the term substrate 102 includes all forms of semiconductor structures.

The substrate serves as the foundation upon which the SSTFB can be built. Advantageously, other devices and structures, such as transistors, diodes, integrated circuits (IC's), etc., can be built alongside and/or on top of the battery 100 discussed herein.

In various embodiments, the conductive electrode layers 104, 112, 120, and 130 may be a metal such as Ni, Pt, Al, Cu, or any other appropriate metal or conductive semiconductor, or any combination thereof. In various embodiments, the conductive electrode layers 104, 112, 120, and 130 may be of the same material or may be different, depending on the semiconductor technology used.

The electrolyte layers 108 and 116, during a discharge of the battery 100, allow ions to be transported from the cathode to the anode of the corresponding cell. Alternatively, during a charge operation, the electrolyte layers 108 and 116 allow ions to be transported from the anode to the cathode (referred to herein as polar conductors). Unlike conventional electrolytes, the electrolytes discussed herein are solid (i.e., not liquid or gel). For example, the electrolyte layers 108 and 116 may be a film of lithium phosphorous oxynitride (LiPON), which is an amorphous glassy material. Instead of having separate components of electrolyte, binder, and separator, the solid electrolytes discussed herein may act as all three. This further increases the overall energy density of the battery 100, because the components of the combination of cells therein are more densely packed.

Further, various degradation effects are avoided by virtue of using solid electrolytes. For example, for conventional batteries using liquid/gel electrolytes, as the battery ages over time, its anode grows granular structures, protruding through the electrolyte, a phenomenon sometimes referred to as dendrites. Dendrites are whiskers of lithium that grow inside batteries, and can cause the devices that are powered thereby to lose power more quickly, short out, or in severe cases, even catch fire or explode. As energy demands per unit area increase, the formation of dendrites becomes a more serious issue. By virtue of using the structures discussed herein including the solid electrolyte, the dendrite problem is essentially eliminated.

The cathode (first polar conductor) layer 106 (and 114 or 118 depending on the parallel or serial configuration discussed above), may comprise metal oxides that are deposited as a film by various methods. An example method is discussed later. In various embodiments, the materials used in the cathode layers may be Lithium Cobalt Oxide (or Lithium Cobaltate), Lithium Manganese Oxide, Lithium Iron Phosphate, Lithium Nickel Manganese Cobalt (NMC), hard carbon, Tin monoxide (SnO) glass, graphite, Si alloys, Cobalt Oxide (CoO or $Co_3O_4$) nano particles, and Lithium Nickel Cobalt Aluminum Oxide (NCA). In one embodiment, the cathode layer may be a film of any positive electrode material having an electric potential greater than 1V in reference to metallic Li.

The anode (second polar conductor) layer 110 (and 114 or 118 depending on the parallel or serial configuration discussed above), may be of graphite or carbon nanotube. In one embodiment, an anode layer may be a film of any negative electrode material that has an electric potential of less than 1V in reference to metallic Li. When the cell of the battery 100 charges and discharges, ions shuttle between cathode (positive electrode) and anode (negative electrode). On discharge, the anode undergoes oxidation, or loss of electrons, and the cathode sees a reduction, or a gain of electrons. Charge reverses the movement, as discussed previously.

Example Processes for Solid-State 3D Batteries

Figure 2B:
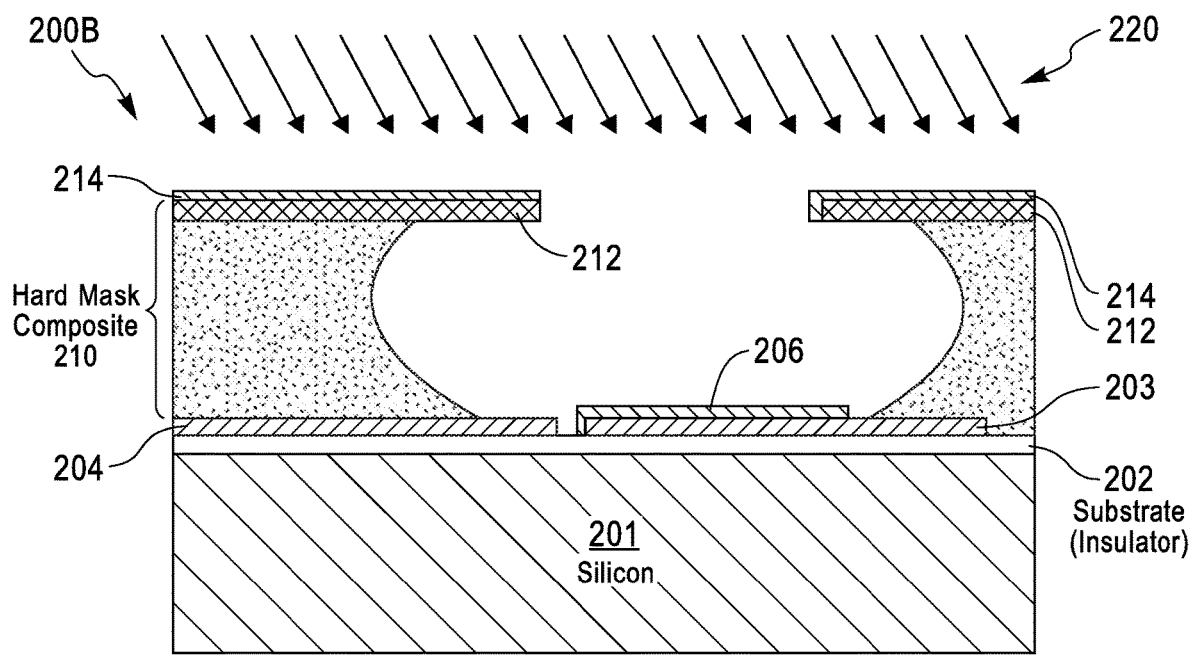
FIG. 2B illustrates a side front-section view of a self-aligned three-dimensional solid state thin film battery during a first polar conductor deposition.

With the foregoing description of the various layers of solid state thin film batteries, it may be helpful to discuss an example process of manufacturing the same. To that end, FIGS. 2A and 2B illustrate a top view and a side front-section view, respectively, of a self-aligned three-dimensional solid state thin film battery (SSTFB) during a first polar conductor (e.g., cathode) deposition. The side front-section view 200B illustrates a bulk material 201, which may be silicon (Si), on top of which the present structure is built.

The front-section view 200B illustrates a substrate layer 202, which may act as an insulator between the cells and the bulk 201, that is deposited over the bulk material 201. There is a first conductive electrode 203 and a second conductive electrode 204 that, in one embodiment, are coplanar. Stated differently, the first and second conductive electrodes 203 and 204 are deposited at the same lithographic step on top of the substrate 202. Although the first and second conductive electrodes 203 and 204 are coplanar, there is no electrical contact between them, since they are separated by at least the metal gap 230 and formed on an insulator.

A hard mask composite 210, which may be based on any suitable material used in semiconductor processing as an etch mask, is deposited over the first conductive electrode layer (203 and 204). There is an opening 232 from which additional deposits can be achieved. Through this opening 232, the hard mask composite 210 is etched, creating a larger opening below the etch mask, sometimes referred to as a sacrificial hard mask 212, that can be defined initially by photoresist. Sometimes it is advantageous to remove the photoresist material if these organic materials outgas in subsequent vacuum deposition tooling that prevents reaching appropriate deposition vacuum levels. In this manner, the photoresist will anisotopically define the top portion of the hard mask composite 210 that is formed from one material, such as oxide, silicon dioxide, nitride, or silicon nitride that has a different chemical etch selectivity compared to the lower part of the hard mask composite, 210, which may be formed from a second material such as polysilicon, or amorphous silicon. In various embodiments, subsequent etching may be by way of a liquid ("wet") or plasma ("dry") chemical agent that isotropically removes the lower portion of the hard mask composite 210 in the areas that are not protected by the top portion of the hard mask composite 212. As illustrated in FIG. 2B an isotropic etch can produce round sidewalls. Alternatively, dry etching techniques can be used, as they can be made anisotropic, in situations where it is desired to avoid significant undercutting of the top portion of the hard mask composite pattern 212. Anisotropic etching becomes more salient when the width of the features to be defined is similar to or less than the thickness of the material being etched. In contrast, a wet etch processes can be used, which are isotropic in nature. As illustrated in FIG. 2B, a wet etch allows a more curved etching, thereby providing a larger opening below the top portion of the hard mask composite 212. In this way, a single top portion of the hard mask composite pattern 212 can be used for multiple layer depositions, as described in more detail below.

The first polar conductor layer (e.g., a cathode) 206 is deposited by way of an intense light 220, referred to herein as an angle deposition. It is understood that an intense light refers to film deposition that may be accomplished in several ways, including what is known in the field as sputtering, which may be accomplished by ion or electric beam impinging on a film target to remove film compound (i.e. Magnetron Sputtering) for deposition onto a sample, or by evaporation accomplished through resistive heating of the film source above the gas phase transition in a given vacuum for deposition onto a sample, etc. In one embodiment, the intense light is at a predetermined angle (that is not perpendicular to the substrate), sometimes referred to herein as a first deposition angle. In this way, the first polar conductor layer 206 can be deposited on top of the first conductive electrode 203 that is beyond the hard mask opening 232. During the deposition of the first polar conductor layer 206, the first conductive electrode 203 is covered in part, but the second conductor 204 is not covered. The electrode layer is also deposited on the photoresist/top portion of the hard mask composite 212 as layer 214. To avoid clutter, some layers (214) and hard mask composites (212, 210) are not shown in the top view of FIG. 2A and subsequent top view FIGS., but are detailed in the side front-section view of FIG. 2B and subsequent side front-section view FIGS.

Figure 3A:
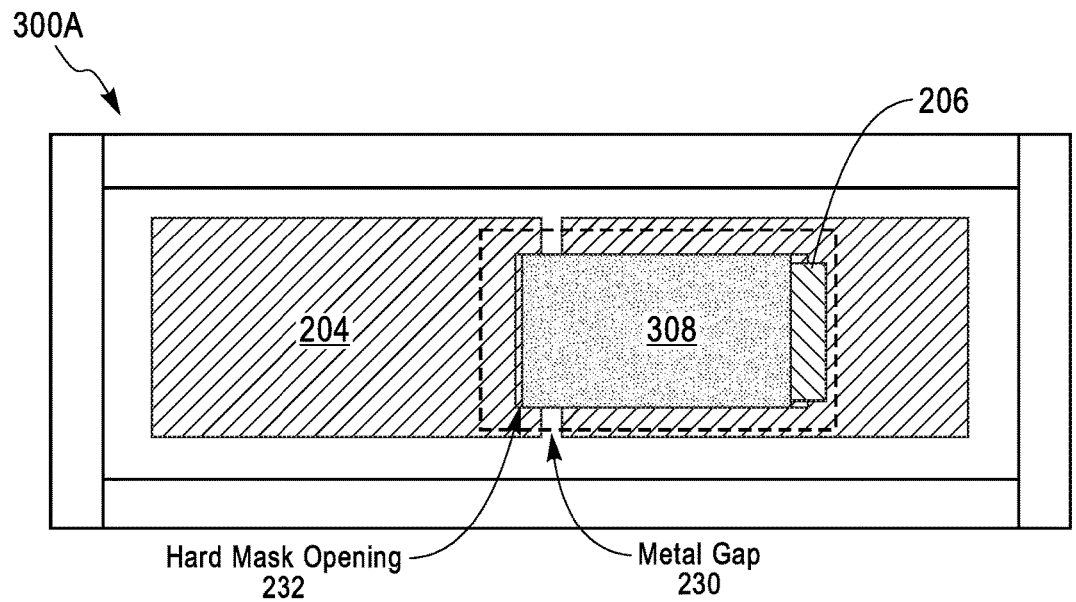
FIG. 3A illustrates a top view of a self-aligned three-dimensional solid state thin film battery during a first electrolyte deposition step.
Figure 3B:
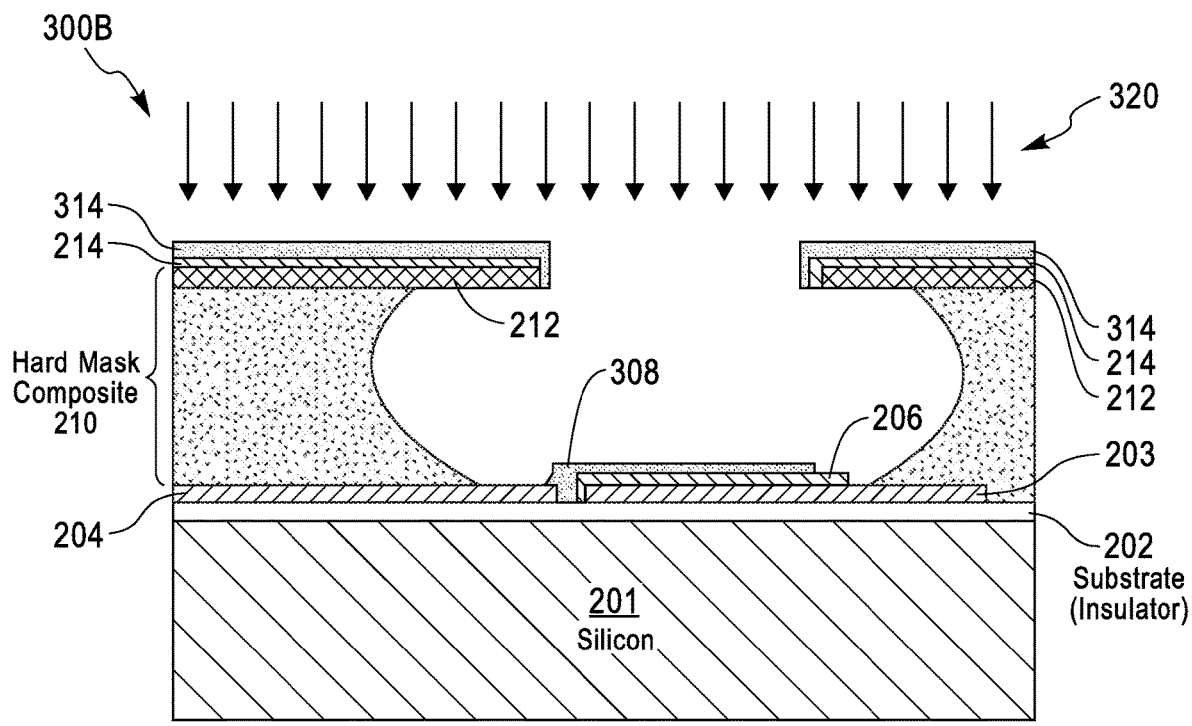
FIG. 3B illustrates a side front-section view of a self-aligned three-dimensional solid state thin film battery during a first electrolyte deposition step.

FIGS. 3A and 3B illustrate a top view and a side front-section view, respectively, of a self-aligned three-dimensional SSTFB during a first electrolyte deposition step. The same opening as in the prior step (i.e., deposition of the first polar conductor) is used, represented by opening 232 in the top view 300A and the photoresist/top portion of the hard mask composite 212 in the front-section view 300B.

The first electrolyte layer 308 is deposited by way of an intense light 320 that, in one embodiment, is in a direction that is substantially perpendicular to the substrate 202. In this way, the first electrolyte 308 can be deposited on top of the first polar conductor 206 and part of the second conductive electrode 204. The first electrolyte layer is also deposited on the photoresist/top portion of the sacrificial hard mask composite 212 on top of layer 214, as layer 314. Significantly, by using the same photoresist/top portion of the sacrificial hard mask composite 212, the first electrolyte layer 308 that is created is self-aligned with the structures below.

Figure 4A:
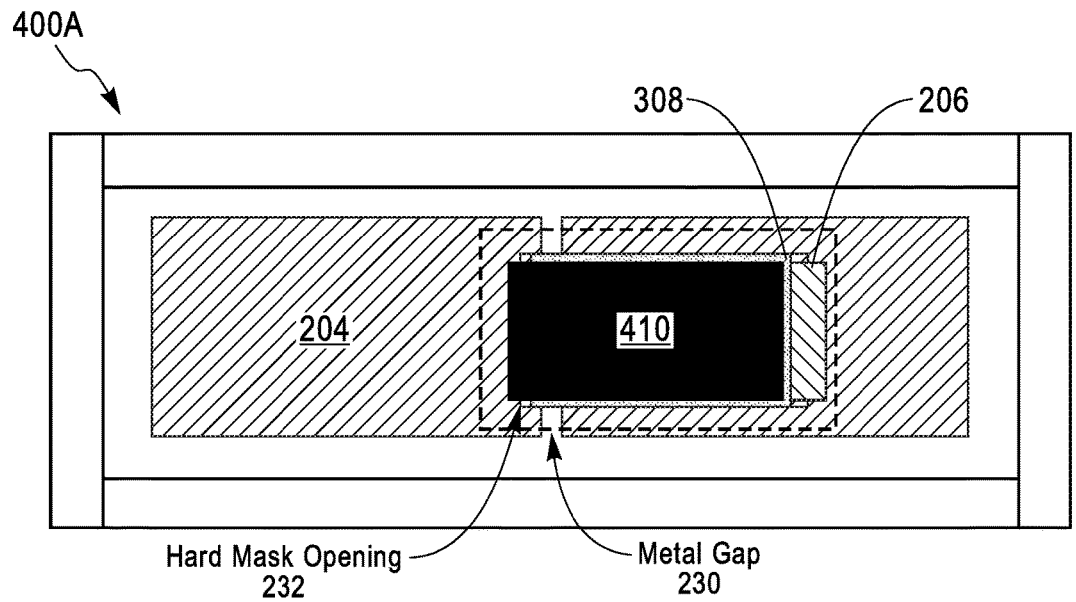
FIG. 4A illustrates a top view of a self-aligned three-dimensional solid state thin film battery during a second polar conductor layer deposition step.
Figure 4B:
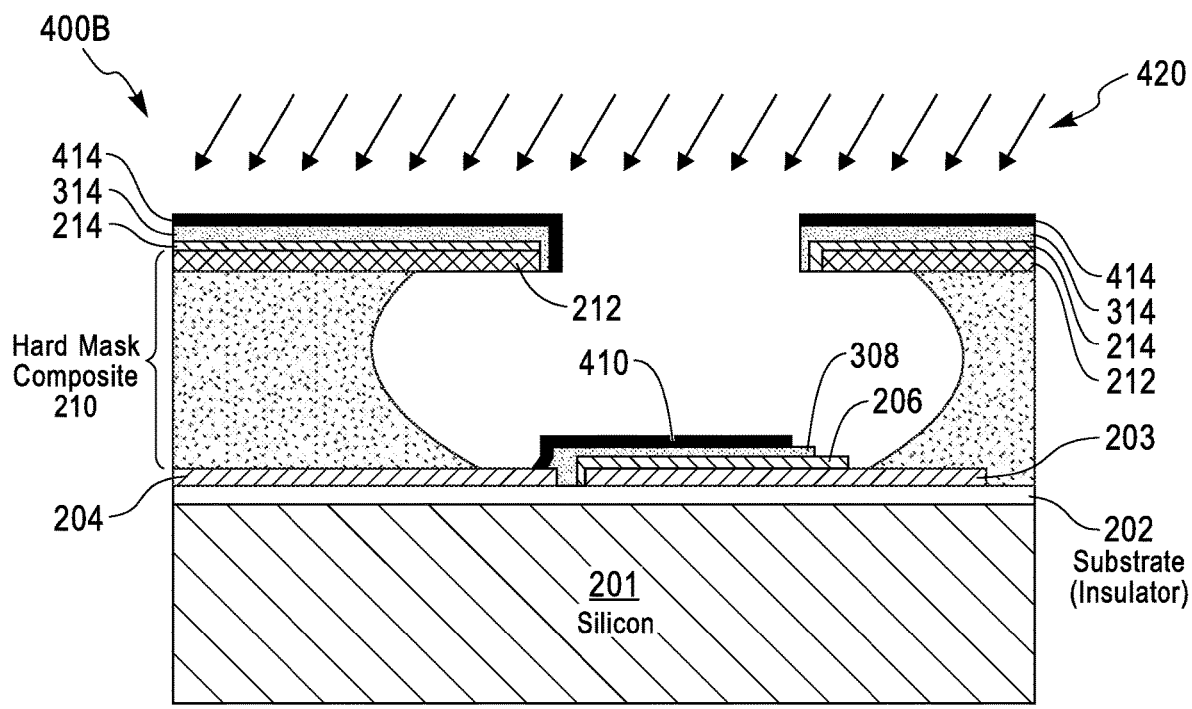
FIG. 4B illustrates a side front-section view of a self-aligned three-dimensional solid state thin film battery during a second polar conductor layer deposition step.

FIGS. 4A and 4B illustrate a top view and a side front-section view, respectively, of a self-aligned three-dimensional SSTFB during a second polar conductor layer (e.g., anode) deposition step. Again, the same opening 232 is used (as in prior steps discussed in the context of FIGS. 2A/B and 3A/B) to introduce the second polar conductor layer 410, which is deposited by way of an intense light 420. In one embodiment, the direction of the intense light 420 is in a direction that is not perpendicular to the substrate 202, but more towards the second conductive electrode 204, sometime referred to herein as a second deposition angle. The second polar conductor layer 410 is also deposited on the photoresist/top portion of the sacrificial hard mask composite 212 on top of layer 314, as layer 414. In this way, the second polar conductor layer (e.g., anode) can be deposited on top of the first electrolyte layer 308 and electrically connected to the second conductive electrode 204. Again, the same photoresist/top portion of the sacrificial hard mask composite 212 mask is used to provide for better self-alignment with the structures below.

Figure 5A:
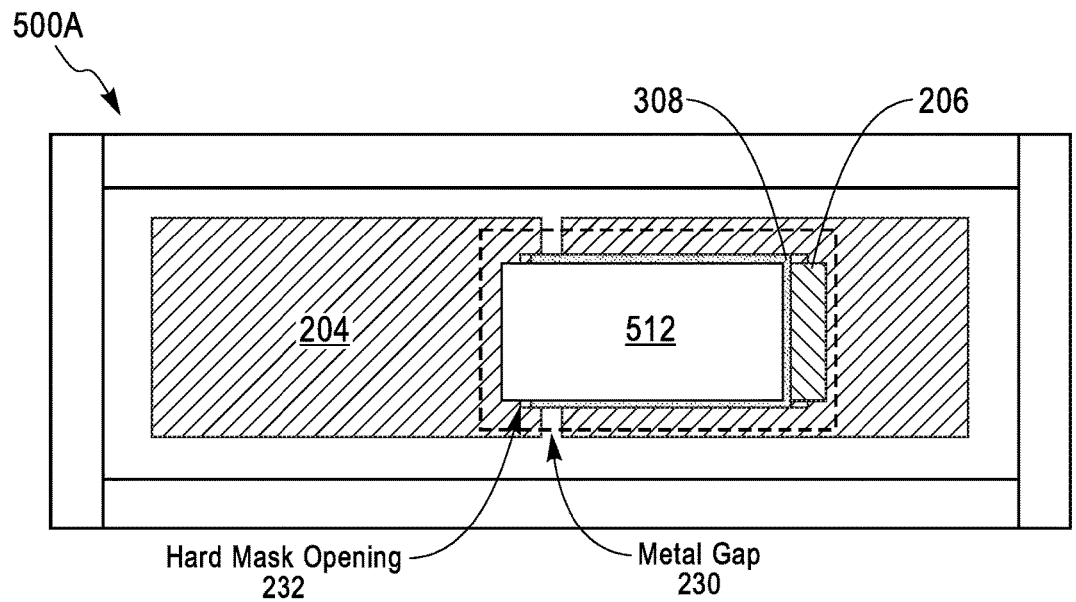
FIG. 5A illustrates a top view of a self-aligned three-dimensional solid state thin film battery during a second conductive electrode layer deposition step.
Figure 5B:
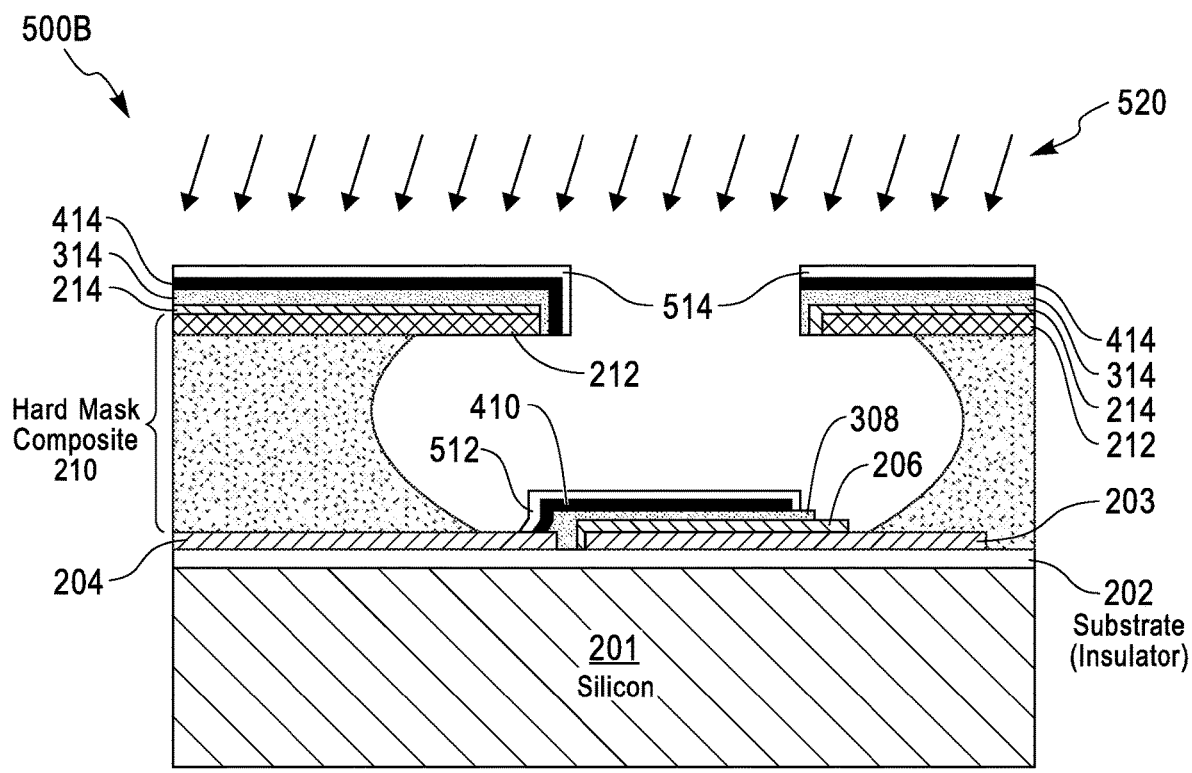
FIG. 5B illustrates a side front-section view of a self-aligned three-dimensional solid state thin film battery during a second conductive electrode layer deposition step.

FIGS. 5A and 5B illustrate a top view and a side front-section view, respectively, of a self-aligned three-dimensional SSTFB during a second conductive electrode layer deposition step. Opening 232 is used to introduce the second conductive electrode layer 512, which is deposited by way of an intense light 520. In one embodiment, intense light 520 is an angle deposition that is in a direction that is not perpendicular to the substrate 202, but more towards the second conductive electrode 204. In one embodiment, the angle of the angle deposition 520, sometimes referred to herein as the third deposition angle, is smaller than that of the intense light 420 of the deposition of the second polar conductor layer. Stated differently, the angle deposition 520 is more perpendicular to the substrate 202 than the angle deposition 420. In various embodiments, different materials may be chosen to control the conductivity of the second conductive electrode layer 512 (and the first conductive electrode layer represented by conductive electrodes 203 and 204). In this way, the resistance between the terminals of the battery 500 can be controlled.

The second conductive electrode layer 512 is also deposited on the photoresist/top portion of the sacrificial hard mask composite 212 on top of layer 414, as layer 514. In this way, the second conductive electrode layer 512 can be deposited on top of the second polar conductor layer (e.g., the anode) 512 and electrically connected to the second conductive electrode 204. Again, the same photoresist/top portion of the sacrificial hard mask composite 212 mask is used to provide for better self-alignment with the structures below. Battery structure 500 represents a complete structure of a first cell (i.e., a 2-D battery). Additional one or more cells can be configured on top of the present battery structure 500 to make 3-D battery structures, as discussed in more detail below.

Figure 6A:
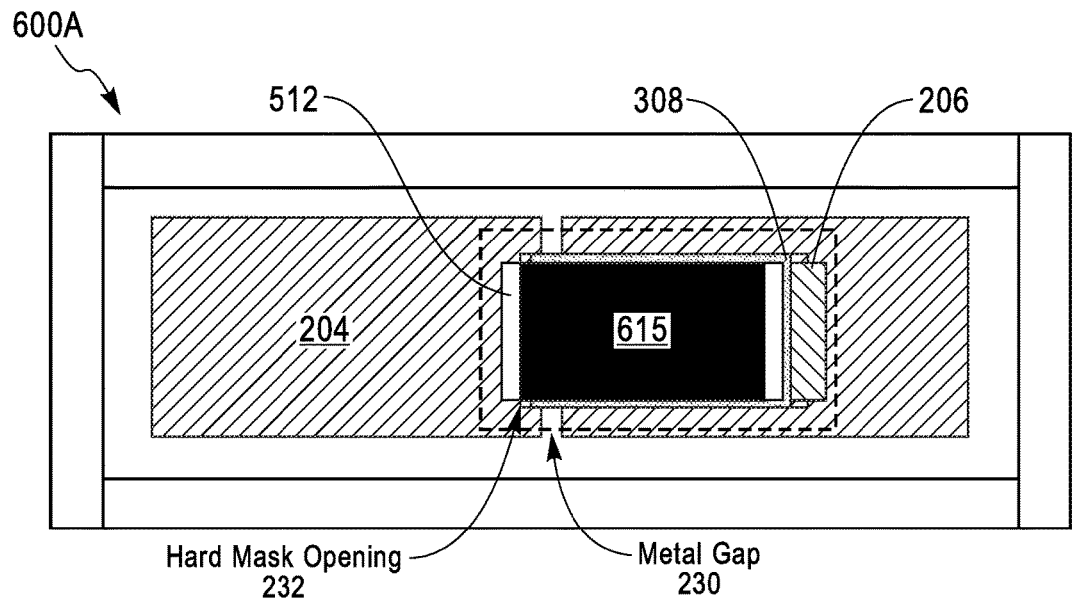
FIG. 6A illustrates a top view and a side front-section view of a self-aligned three-dimensional solid state thin film battery during a third polar conductor layer deposition step.
Figure 6B:
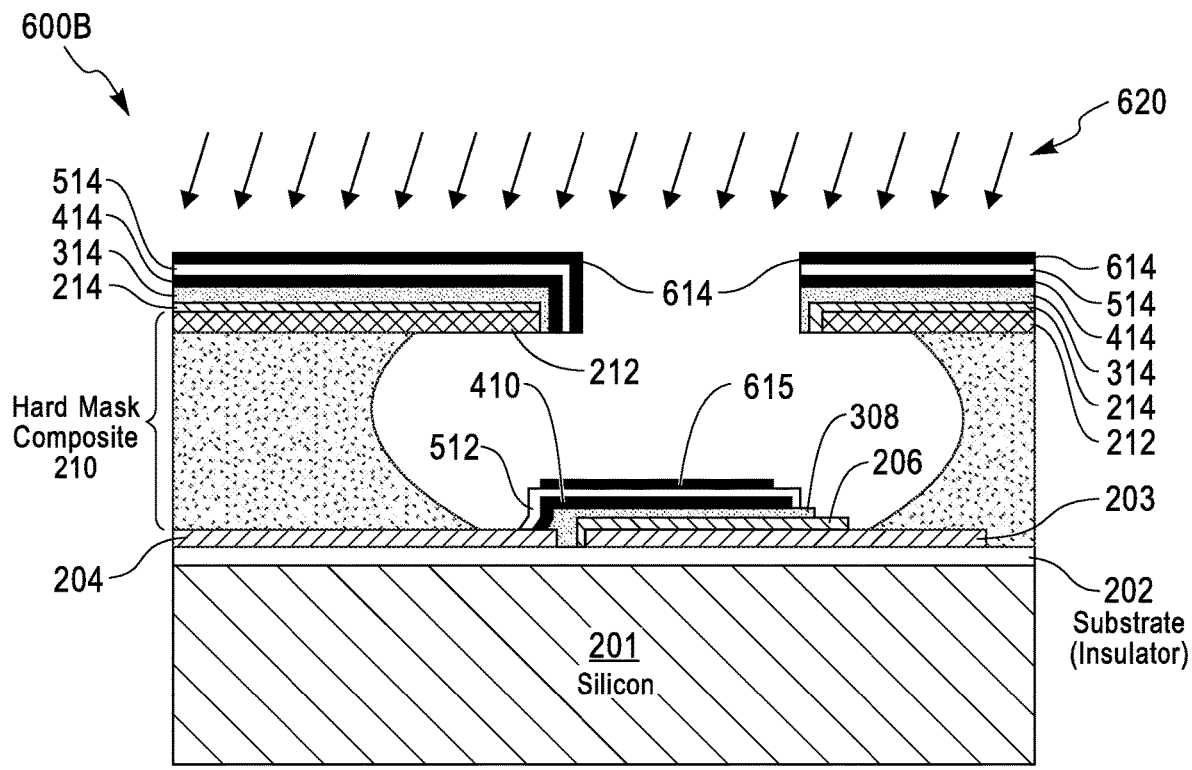
FIG. 6B illustrates a side front-section view of a self-aligned three-dimensional solid state thin film battery during a third polar conductor layer deposition step.

FIGS. 6A and 6B illustrate a top view and a side front-section view, respectively, of a self-aligned three-dimensional SSTFB during a third polar conductor layer deposition step. In various embodiments, the third polar conductor layer 615 may be an anode or cathode. For example, when the battery 600A/B is configured to have several cells in parallel for increased power, the third polar conductor layer 615 is an anode. However, when configured to have several cells in series for increased voltage, the third polar conductor layer 615 is a cathode.

Again, the same opening 232 is used (as in prior steps discussed herein) to introduce the third polar conductor layer 615, which is deposited by way of an intense light 620. In one embodiment, the direction of the intense light 620 is in a direction that is not perpendicular to the substrate 202, but more towards the second conductive electrode 204. In one embodiment, the angle of the angle deposition 620 is substantially similar to that of the angle of the intense light 520 of the third polar conductor deposition (i.e., the third deposition angle).

The third polar conductor layer 615 is also deposited on the photoresist/top portion of the sacrificial hard mask composite 212 on top of layer 514, as layer 614. Better self-alignment with the structures below is provided by using the same photoresist mask 212 as in previous steps.

Figure 7A:
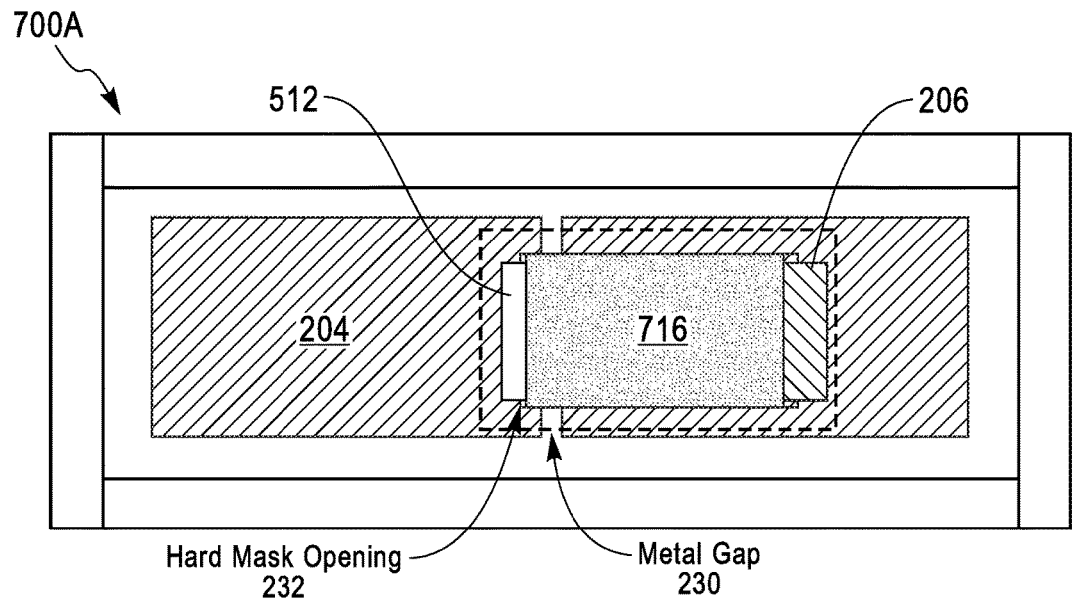
FIG. 7A illustrates a top view front-section view of a self-aligned three-dimensional solid state thin film battery during a second electrolyte layer deposition step.
Figure 7B:
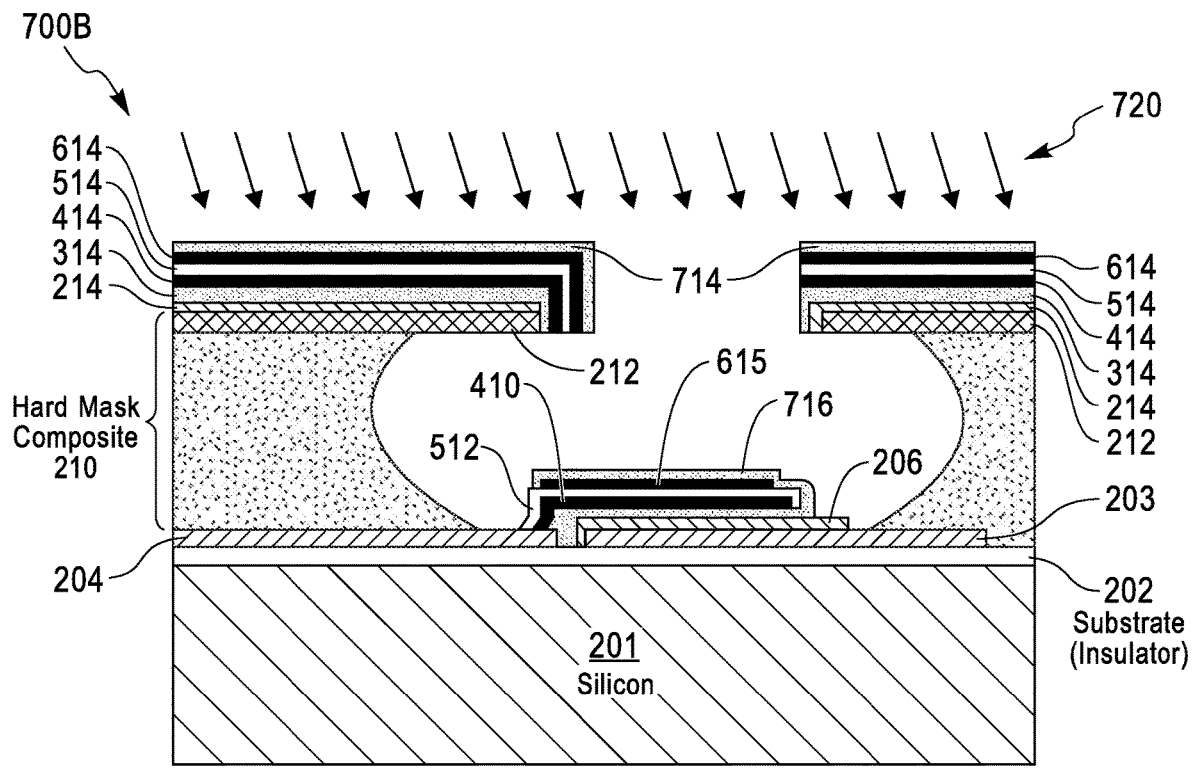
FIG. 7B illustrates a side front-section view of a self-aligned three-dimensional solid state thin film battery during a second electrolyte layer deposition step.

FIGS. 7A and 7B illustrate a top view and a side front-section view, respectively, of a self-aligned three-dimensional SSTFB during a second electrolyte layer deposition step. The same opening 232 and photoresist/top portion of the sacrificial hard mask composite 212 are used to create the third electrolyte layer 716. The third electrolyte layer 716 is deposited by way of an intense light 720 that, in one embodiment, is in a direction that is that is not perpendicular to the substrate 202, but more towards the first conductive electrode 203. In one embodiment, this angle deposition is at an angle such that the deposited film completely covers the right-hand side of the polar conductor layer 615 and the second conductive electrode layer 512 to prevent the subsequent fourth polar conductor layer 818 from shorting to the polar conductor layer 615 and/or the second conductive electrode layer 512. In various embodiments, the second electrolyte layer 716 may be of the same material or of a different material than that of the first electrolyte layer 308. In this way, the voltage of each cell can be adjusted, facilitating the generation of tailored voltages. For example, a first cell in the battery 700A/B may have an electrolyte that provides a 4V cell. A second cell in the battery 700A/B placed in series with the first cell can be of a different voltage, such as 2V, thereby providing a tailored 6V voltage source to a load coupled to the battery 700A/B.

As illustrated in FIG. 7B, the second electrolyte layer 716 is deposited on top of the third polar conductor layer 615. In one embodiment, the second electrolyte layer 716 is in electrical contact with the first electrolyte layer 308, thereby creating a single electrolyte structure. The first electrolyte layer is also deposited on the photoresist/top portion of the sacrificial hard mask composite 212 on top of layer 614, as layer 714. By using the same photoresist/top portion of the sacrificial hard mask composite 212, the second electrolyte layer 716 is self-aligned with the structures below.

Figure 8A:
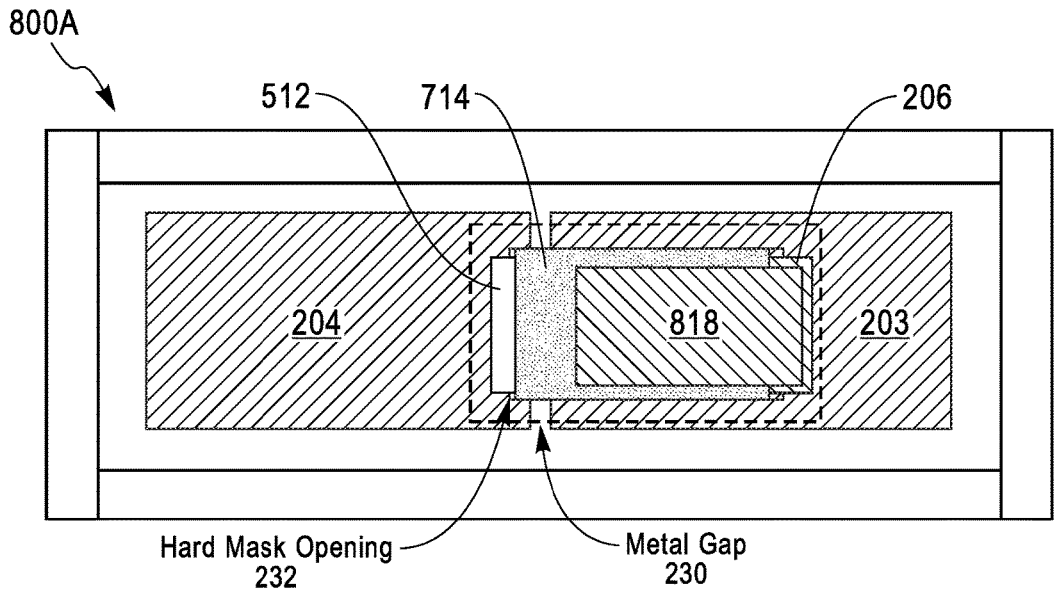
FIG. 8A illustrates a top view of a self-aligned three-dimensional solid state thin film battery during a fourth polar conductor layer deposition step.
Figure 8B:
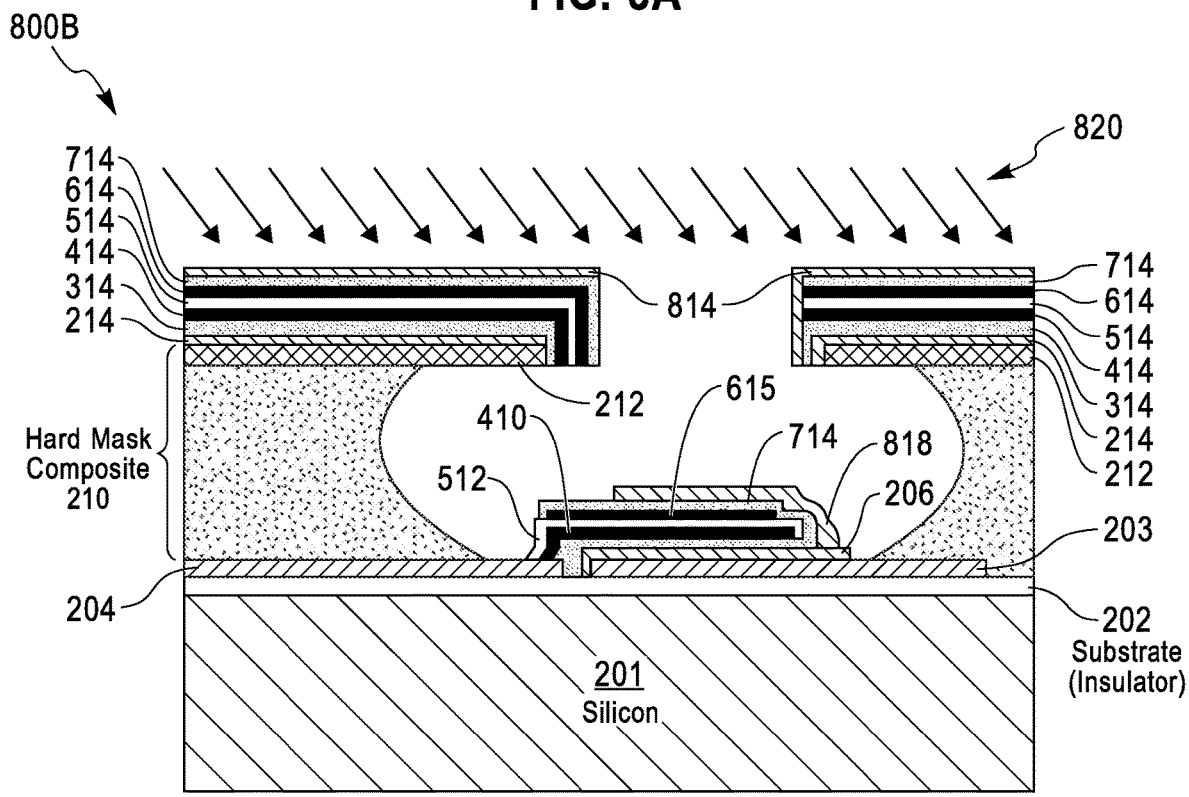
FIG. 8B illustrates a top view a front-section view of a self-aligned three-dimensional solid state thin film battery during a fourth polar conductor layer deposition step.

FIGS. 8A and 8B illustrate a top view and a side front-section view, respectively, of a self-aligned three-dimensional SSTFB during a fourth polar conductor layer deposition step. In various embodiments, the fourth polar conductor layer 818 may be an anode or cathode. For example, when the battery 800A/B is configured to have several cells in parallel for increased power, the fourth polar conductor layer 818 is a cathode. However, when configured to have several cells in series for increased voltage, the fourth polar conductor layer 818 is an anode.

As in previous deposition steps, the same opening 232 is used to introduce the fourth polar conductor layer 818, which is deposited by way of an intense light 820. In one embodiment, the direction of the intense light 820 is at an angle that is not perpendicular to the substrate 202, but more towards the first conductive electrode 203. In one embodiment, the angle of the angle deposition 820 is substantially similar to that of the angle of the intense light 220 of the first polar conductor deposition (i.e., first deposition angle), as illustrated in FIG. 2B.

As illustrated in FIG. 8B, the fourth polar conductor layer 818 is deposited on top of the second electrolyte layer 714. The fourth polar conductor layer 818 is in electrical contact with the first polar conductor layer 206, thereby creating a single three-dimensional electrode structure.

The fourth polar conductor layer 818 is also deposited on the photoresist/top portion of the sacrificial hard mask composite 212 on top of layer 714, as layer 814. Better self-alignment with the structures below is provided by using the same photoresist mask 212 as in previous steps.

Figure 9A:
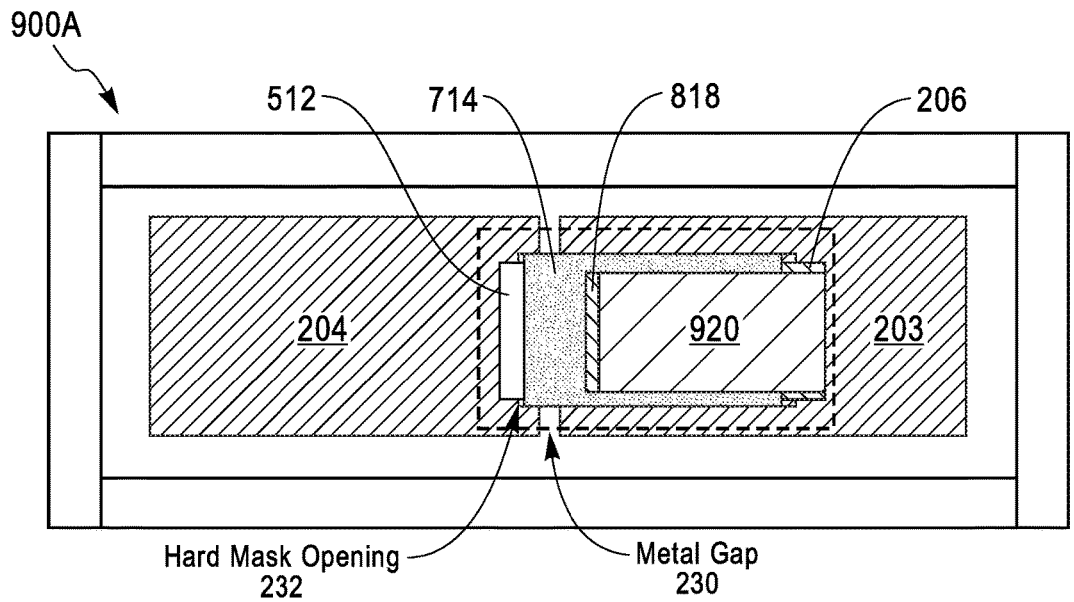
FIG. 9A illustrates a top view of a self-aligned three-dimensional solid state thin film battery during a third conductive electrode layer deposition step.
Figure 9B:
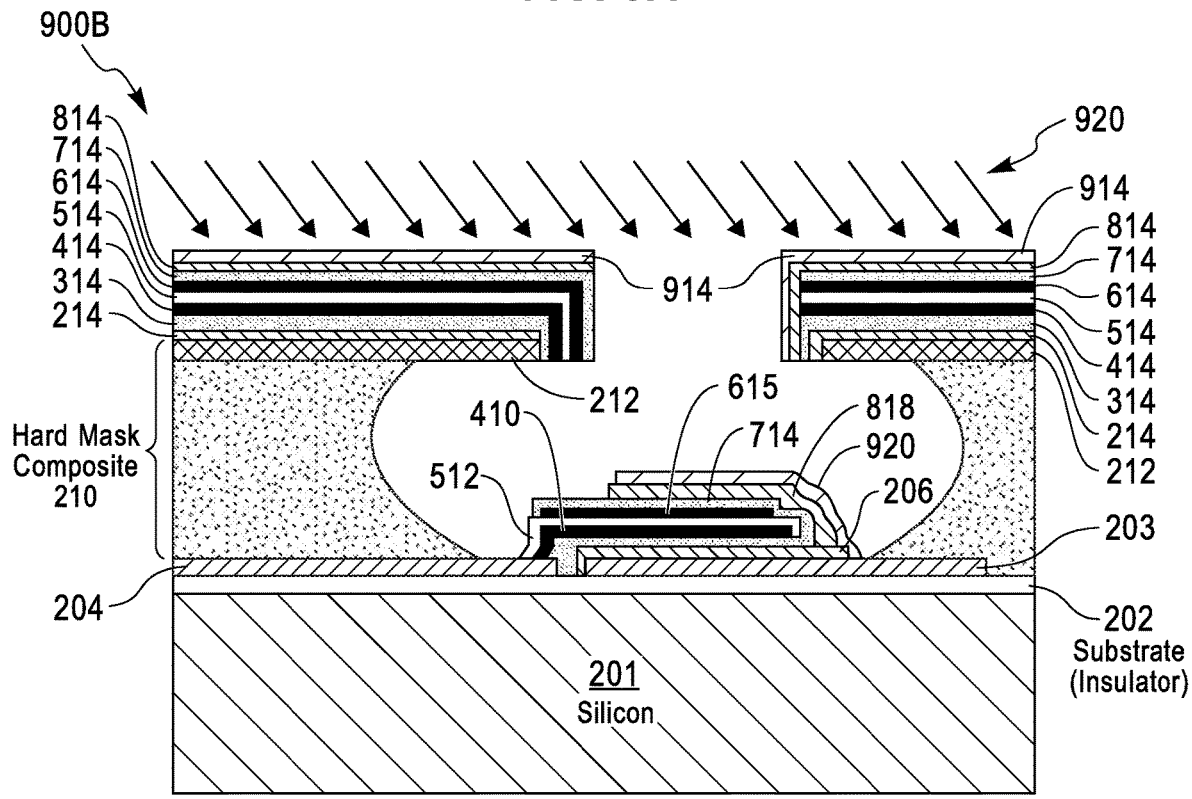
FIG. 9B illustrates a side front-section view of a self-aligned three-dimensional solid state thin film battery during a third conductive electrode layer deposition step.

FIGS. 9A and 9B illustrate a top view and a side front-section view, respectively, of a self-aligned three-dimensional SSTFB during a third conductive electrode layer deposition step. Opening 232 is used to introduce the third conductive electrode layer 920, which is deposited by way of an intense light 920. In one embodiment, the direction of the intense light 920 is at an angle that is not perpendicular to the substrate 202, but more towards the first conductive electrode 203. In one embodiment, the angle of the angle deposition 920 is substantially similar to that of the angle of the intense light 820 of the fourth polar conductor layer deposition (i.e., first deposition angle), as illustrated in FIG. 8B.

As illustrated in FIG. 9B, the third conductive electrode layer is deposited on top of the fourth polar conductor layer 818. Accordingly, the third conductive electrode layer 920 is in electrical contact with the fourth polar conductor layer 818 and the first polar conductor layer 206, thereby creating a single three-dimensional conductive structure.

The third conductive electrode layer is also deposited on the photoresist/top portion of the sacrificial hard mask composite 212 on top of layer 818, as layer 920. Better self-alignment with the structures below is provided by using the same photoresist mask 212 as in previous steps.

While FIGS. 2A/B to 9A/B illustrate an example stacking of two battery cells, it will be understood that additional cells can be stacked, in view of the teachings herein. In various embodiments, the additional cells may be coupled in series and/or in parallel via additional deposition layers through the opening 232.

By virtue of using the same photoresist pattern 212, the battery cells that are created are self-aligned and the process is simplified compared to other processes that use additional mask layers for the deposition of films. Thus, unlike conventional batteries, at least some of the layers discussed herein are self-aligned, which facilitates scalability and further miniaturization. Stated differently, since various layers discussed herein are self-aligned, regions that are typically wasted are avoided, thereby yielding a more compact battery size for a given energy density.

Example 3D Energy Storage Structures

Figure 10:
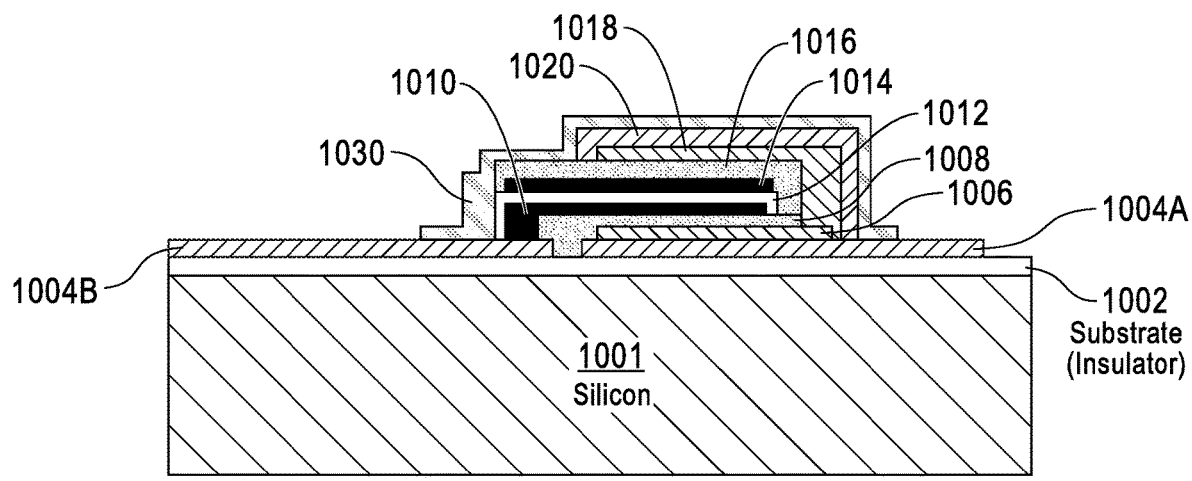
FIG. 10 illustrates a cross-section view of a 3D energy storage structure having two solid state thin film batteries that are connected in parallel, consistent with an exemplary embodiment.

As discussed above, the teachings herein provide for self-aligned three-dimensional SSTFBs that may be configured in series, parallel, or combinations thereof. These structures may function as a primary battery, a secondary battery, or a super capacitor. In this regard, FIG. 10 illustrates a cross-section view of a 3D energy storage structure having two SSTFBs that are connected in parallel, consistent with an exemplary embodiment. Battery 1000 represents an example battery that can be implemented by the process discussed herein. Battery 1000 includes an electrically insulating base material 1001, such as silicon with an insulator cap, on top of which the remaining structure is built. There is a substrate 1002, a first conductive electrode layer having a first conductive electrode 1004A and a second conductive electrode 1004B on top of the substrate 1002. The first and second conductive electrodes 1004A and 1004B are coplanar, but electrically separate (i.e., disconnected). The first polar conductor layer 1006 (i.e., first cathode) is on top of the first conductive electrode layer.

There is a first solid electrolyte layer 1008 on top of the first polar conductor layer 1006. There is a second polar conductor layer 1010 (e.g., first anode) on top of the first solid electrolyte layer 1008. There is a second conductive electrode layer 1012 on top of the second polar conductor 1010. Layers or components 1004A 1006, 1008, 1010, and 1012 include the first cell of the battery 1000.

There is a third polar conductor layer 1014 (i.e., an anode) on top of the second conductive electrode layer 1012. There is a second solid electrolyte layer 1016 on top of the third polar conductor layer 1014. There is a fourth polar conductor layer 1018 (i.e., a cathode) that is on top of the second solid electrolyte layer 1016. There is a third conductive electrode layer on top of the fourth polar conductor layer 1018. Layers or components 1014, 1016, and 1020 are part of the second cell of the battery 1000, which is coupled electrically in parallel with the first cell to provide more current density. Stated differently, since the two cathodes 1006 and 1018 are electrically coupled, and the two anodes 1010 and 1014 are electrically coupled, the resulting structure is a battery 1000 having two cells in parallel.

To accommodate the high reactivity of some battery layers with the environment, such as lithium, a passivation layer 1030 is included. The passivation layer 1030 may be based on a film of lithium chloride (LiCl) that is formed on the surface, or a separate layer, such as the family of polyimides. It serves to protect the battery 1000 from discharging on its own and/or degrading with the environment when a load is removed from the battery 1000.

Figure 11:
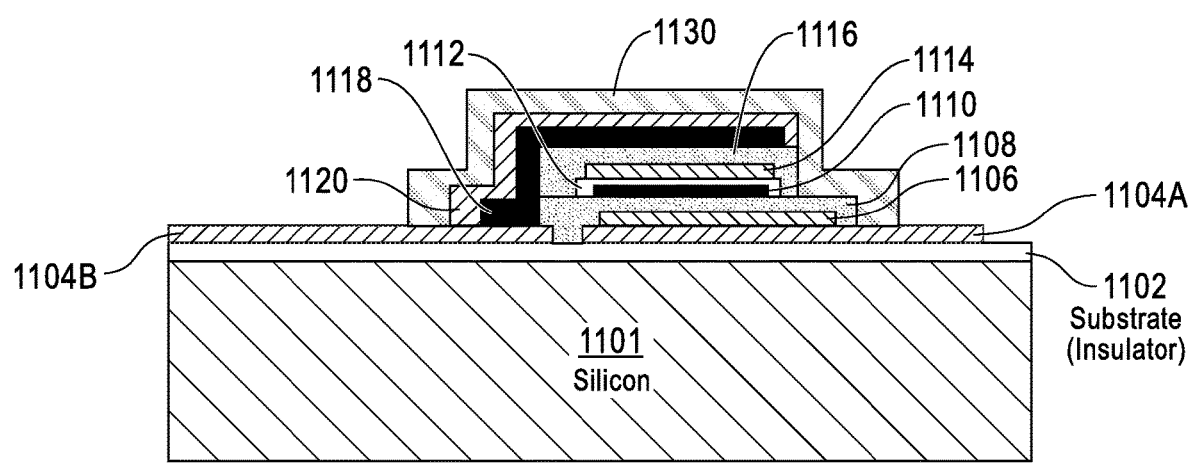
FIG. 11 illustrates a cross-section view of a 3D energy storage structure having two solid state thin film batteries that are connected in series, consistent with an exemplary embodiment.

Reference now is made to FIG. 11, which illustrates a cross-section view of a 3D energy storage structure having two SSTFBs that are connected in series, consistent with an exemplary embodiment. Battery 1100 represents another example 3D battery that can be implemented by the process discussed herein. While two cells that are stacked in series are illustrated, it will be understood that additional cells may be stacked in series or in parallel based on the teachings herein.

Battery 1100 includes a base material 1101, such as silicon with an insulator cap or silicon dioxide, on top of which the remaining structure is built. There is a substrate 1102, a first conductive electrode layer having a first conductive electrode 1104A and a second conductive electrode 1104B on top of the substrate 1102. The first and second conductive electrodes 1104A and 1104B are coplanar, but electrically separate. The first polar conductor layer 1106 (i.e., first cathode) is on top of the first conductive electrode layer.

There is a first solid electrolyte layer 1108 on top of the first polar conductor layer 1106. There is a second polar conductor layer 1110 (e.g., first anode) on top of the first solid electrolyte layer 1108. There is a second conductive electrode layer 1112 on top of the second polar conductor 1110. Layers or components 1104A 1106, 1108, 1110, and 1112 include the first cell of the battery 1100.

There is a third polar conductor layer 1114 (i.e., a cathode) on top of the second conductive electrode layer 1112. There is a second solid electrolyte layer 1116 on top of the third polar conductor layer 1114. There is a fourth polar conductor layer 1118 (i.e., an anode) that is on top of the second solid electrolyte layer 1116. There is a third conductive electrode layer on top of the fourth polar conductor layer 1118. Layers or components 1114, 1116, and 1120 are part of the second cell of the battery 1100, which is coupled electrically in series with the first cell to provide a higher voltage. Stated differently, since the anode 1110 of the first cell is coupled to the cathode 1114 of the second cell, the two cells are electrically coupled in series. Similar to battery 1000, a passivation layer 1130 is included.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of creating a solid state electrochemical battery, the method comprising:
    depositing a first conductive electrode layer on top of a substrate;
    depositing a first polar conductor layer on top of the conductive electrode layer;
    depositing a first solid electrolyte layer on top of the first polar conductor layer;
    depositing a second polar conductor layer on top of the first solid electrolyte layer;
    depositing a second conductive electrode layer on top of the second polar conductor layer;

depositing a third polar conductor layer on top of the second conductive electrode layer;

depositing a second solid electrolyte layer on top of the third polar conductor layer;

depositing a fourth polar conductor layer on top of the second solid electrolyte layer; and depositing a third conductive electrode layer on top of the fourth polar conductor layer, wherein the first polar conductor layer, the fourth polar conductor layer, and the third conductive electrode layer are each deposited by an intense light at a first deposition angle that is not perpendicular to the substrate.

2. The method of claim 1, further comprising:

including a cathode of a first cell of the battery in first polar conductor layer; and including an anode of the first cell of the battery in the second polar conductor layer.

3. The method of claim 2, further comprising:

including an anode of a second cell of the battery in the third polar conductor layer;

includes a cathode of the second cell of the battery in the fourth polar conductor layer; and electrically connecting the second cell in parallel with the first cell of the battery.

4. The method of claim 2, further comprising:

including a cathode of a second cell of the battery in the third polar conductor layer;

including an anode of the second cell of the battery in the fourth polar conductor layer; and electrically connecting the second cell in series with the first cell of the battery.

5. The method of claim 1, further comprising: including a first conductive electrode and a second conductive electrode in the first conductive electrode layer, wherein the first conductive electrode and the second conductive electrode are electrically separate.

6. The method of claim 1, wherein a material of the first electrolyte layer is different from a material of the second electrolyte layer.

7. The method of claim 1, wherein a plurality of the following layers is self-aligned:

the first conductive electrode layer on top of the substrate;

the first polar conductor layer on top of the conductive electrode layer;

the first solid electrolyte layer on top of the first polar conductor layer;

the second polar conductor layer on top of the first solid electrolyte layer;

the second conductive electrode layer on top of the second polar conductor layer;

the third polar conductor layer on top of the second conductive electrode layer;

the second solid electrolyte layer on top of the third polar conductor layer;

the fourth polar conductor layer on top of the second solid electrolyte layer; and the third conductive electrode layer on top of the fourth polar conductor layer.

8. The method of claim 1, wherein the following layers are self-aligned:

the first conductive electrode layer on top of the substrate;

the first polar conductor layer on top of the conductive electrode layer;

the first solid electrolyte layer on top of the first polar conductor layer;

the second polar conductor layer on top of the first solid electrolyte layer;

the second conductive electrode layer on top of the second polar conductor layer;

the third polar conductor layer on top of the second conductive electrode layer;

the second solid electrolyte layer on top of the third polar conductor layer;

the fourth polar conductor layer on top of the second solid electrolyte layer; and the third conductive electrode layer on top of the fourth polar conductor layer.

9. The method of claim 1, wherein the second polar conductor layer is deposited by an intense light at a second deposition angle that is not perpendicular to the substrate and different from the first deposition angle.

10. The method of claim 1, wherein the second conductive electrode layer, the third polar conductor layer, and the second electrolyte layer are each deposited by an intense light at a third deposition angle that is not perpendicular to the substrate and different from the first and second deposition angles.

* * * * *